(12) United States Patent
Sakaguchi et al.

(10) Patent No.: US 8,362,697 B2
(45) Date of Patent: Jan. 29, 2013

(54) DISPLAY APPARATUS

(75) Inventors: Kiyofumi Sakaguchi, Mobara (JP);
Yasushi Iwakura, Funabashi (JP);
Kohei Nagayama, Chiba (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/856,535

(22) Filed: Aug. 13, 2010

(65) Prior Publication Data
US 2011/0031514 A1 Feb. 10, 2011

Related U.S. Application Data

(63) Continuation of application No. PCT/JP2009/063968, filed on Aug. 6, 2009.

(51) Int. Cl.
*H01L 51/50* (2006.01)
*H01L 51/52* (2006.01)

(52) U.S. Cl. ......... 313/512; 313/110; 313/501; 313/506

(58) Field of Classification Search .......... 313/500–512, 313/110–112
See application file for complete search history.

(56) References Cited

U.S. PATENT DOCUMENTS

| 7,781,967 B2 * | 8/2010 | Hayashi ........................ 313/512 |
| 2003/0209708 A1 | 11/2003 | Kubota |
| 2004/0000864 A1 | 1/2004 | Kato |
| 2004/0263039 A1 * | 12/2004 | Takei et al. ................... 313/110 |
| 2005/0231085 A1 * | 10/2005 | Song et al. ..................... 313/506 |
| 2007/0285410 A1 | 12/2007 | Shibasaki |
| 2008/0079355 A1 | 4/2008 | Smith |
| 2009/0115321 A1 * | 5/2009 | Hayashi ........................ 313/504 |

FOREIGN PATENT DOCUMENTS

| DE | 19623881 A1 * | 12/1997 |
| JP | 06027455 A * | 2/1994 |
| JP | 11074072 A * | 3/1999 |
| JP | 2002-025765 A | 1/2002 |
| JP | 2003-282241 A | 10/2003 |
| JP | 2004-31215 A | 1/2004 |
| JP | 2004-039500 A | 2/2004 |
| JP | 2005-353500 A | 12/2005 |
| JP | 2006-205364 A | 8/2006 |
| JP | 2007-328986 A | 12/2007 |
| JP | 2008-525955 T | 7/2008 |

OTHER PUBLICATIONS

English machine translation JP 06027455 A (published Feb. 1994).*
English machine translation JP 2005-353500 A (published Dec. 2005).*
U.S. Appl. No. 12/893,929, filed Sep. 29, 2010, Noa Sumida.
U.S. Appl. No. 12/819,087, filed Jun. 18, 2010, Nozomu Izumi.

* cited by examiner

*Primary Examiner* — Mariceli Santiago
(74) *Attorney, Agent, or Firm* — Canon U.S.A., Inc., IP Division

(57) ABSTRACT

There is provided a display apparatus that can improve the protective function and light utilization efficiency of organic EL devices and that has a simple structure. The display apparatus includes a plurality of organic EL devices formed on a substrate and a protective layer formed on the organic EL devices. The protective layer includes a first protective layer made of an inorganic material, a second protective layer made of a resin and having a microlens formed therein, and a third protective layer made of an inorganic material.

6 Claims, 7 Drawing Sheets

US 8,362,697 B2

DISPLAY APPARATUS

This application is a Continuation of International Application No. PCT/JP2009/063968, filed Aug. 6, 2009, which is hereby incorporated by reference herein in its entirety.

TECHNICAL FIELD

The present invention relates to a display apparatus using an organic EL (electroluminescent) device, and particularly to a display apparatus using an organic EL device that can improve light utilization efficiency.

BACKGROUND ART

Organic compound layers such as electrodes, light-emitting layers, and hole-transporting layers of organic EL devices are easily corroded and oxidized due to reactions with water and oxygen in the air. Such corrosion and oxidation cause non-light-emitting portions called dark spots to markedly grow and degrade the characteristics of organic EL devices over time. Herein, the cause of the growth of dark spots will be described.

The surface of organic EL devices are normally covered with a protective layer to prevent contact between water and oxygen in the air and the organic compound layers. However, particles such as etching residues and dust created in a manufacturing process sometimes make a pin hole in part of the protective layer. Oxygen and water then enter the inside of the device through the pin hole and create dark spots. To prevent oxygen and water from entering the inside, the protective layer needs to be thickened to sufficiently cover the particles. However, when the protective layer is made of an inorganic material such as SiN, the takt time of production is increased because of the film formation performed by CVD or the like, which poses a problem of an increase in cost. On the other hand, there has been proposed a structure in which such particles are sufficiently covered with a resin layer formed by a simple method such as coating and a protective layer made of a closely packed inorganic material is formed on the resin layer.

For example, Patent Literature 1 discloses a sealing technology in which a protective layer having a multilayer structure including silicon oxynitride (SiON) layer/organic material layer/silicon oxynitride (SiON) layer is formed on an upper electrode of an organic EL device.

Another problem of organic EL devices is that light extraction efficiency is poor. This is because, since light is emitted from a light-emitting layer at various angles in an organic EL device, many total reflection components are generated at a boundary surface between a protective layer and the outside and thus the emitted light is confined inside the device. To solve the problem, many structures have been proposed. For example, Patent Literature 2 discloses a structure in which a microlens array made of a resin is arranged on a silicon oxynitride ($SiN_xO_y$) film that seals an organic EL device to improve light extraction efficiency.

The combination of the protective layer having a multilayer structure disclosed in Patent Literature 1 with the microlens disclosed in Patent Literature 2 poses the following problem.

That is to say, if a microlens array made of a resin is arranged on a multilayer structure that functions as a protective layer, the microlens itself is exposed to an external atmosphere. Therefore, water in the atmosphere easily enters the microlens and thus the refractive index and shape are changed due to swelling, which degrades the functions of the lens.

To solve the problem, there may be employed a structure in which an outermost protective layer made of an inorganic material such as SiN is formed on a surface of a microlens. However, in this case, a five-layer structure is required because of the protective layer having three sub-layers and a resin layer constituting the microlens, which increases the cost. Such a structure also increases the number of layer interfaces constituting reflection interfaces, and the amount of emitted light confined inside the device is increased. As a result, light extraction efficiency is decreased and an advantage of disposing a microlens is lost.

An object of the present invention is to provide a display apparatus using an organic EL device that suppresses the generation of dark spots, has high light extraction efficiency, and can be manufactured at low cost.

Citation List

Patent Literature

PTL 1: Japanese Unexamined Patent Application Publication No. 2002-025765

PTL 2: Japanese Unexamined Patent Application Publication No. 2004-039500

SUMMARY OF INVENTION

The present invention provides a display apparatus including a plurality of organic EL devices each including a pair of electrodes and an organic compound layer that includes a light-emitting layer and is sandwiched between the pair of electrodes, the plurality of organic EL devices being formed on a substrate; and a protective layer formed on the plurality of organic EL devices, wherein the protective layer includes a first protective layer made of an inorganic material, a second protective layer formed on the first protective layer and made of a resin material, and a third protective layer formed on the second protective layer and made of an inorganic material; and a microlens configured to condense at least part of light emitted at the light-emitting layer is formed in the second protective layer.

ADVANTAGEOUS EFFECTS OF INVENTION

According to the above-described structure of the present invention, particles such as etching residues and dust can be sufficiently covered with a second protective layer made of a resin material that can be easily thickened, and light utilization efficiency can be improved with a function of a microlens. Furthermore, since a third protective layer made of an inorganic material is formed on a surface of the microlens, a change in the microlens over time can be suppressed and thus light extraction efficiency is stably improved. In addition, since the second protective layer made of a resin material also serves as a resin layer constituting the microlens, the total number of layers can be decreased. Thus, the manufacturing cost can be reduced.

Further features of the present invention will become apparent from the following description of exemplary embodiments with reference to the attached drawings.

DESCRIPTION OF EMBODIMENTS

<Organic EL Display Apparatus>

A display apparatus according to an embodiment of the present invention will now be described with reference to the attached drawings.

Figure 1:
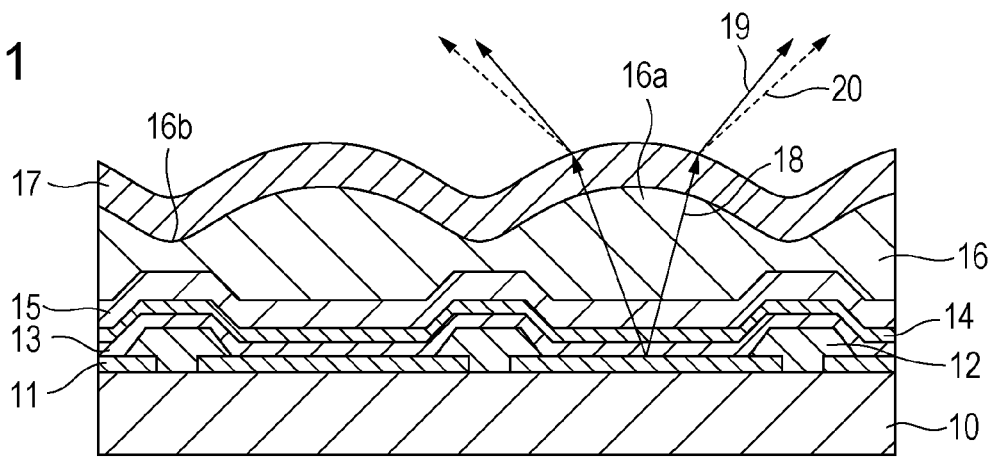
FIG. 1 is a partial sectional view showing an embodiment of the present invention.

FIG. 1 is a partial sectional view showing a display apparatus according to an embodiment of the present invention. The display apparatus is a top emission-type display apparatus in which light is extracted from the upper surface of organic EL devices formed on a substrate in an upward direction of FIG. 1.

The display apparatus of the present invention includes a substrate 10 and a plurality of pixels formed on the substrate 10 in a matrix to constitute a display region. Herein, a pixel means a region corresponding to a single light-emitting device. In the present invention, organic EL devices that function as a light-emitting device are formed in the plurality of pixels, and a pixel separating layer 12 that separates the pixels is formed between the organic EL devices. Each of the organic EL devices includes a pair of electrodes, namely an anode 11 and a cathode 14, and an organic compound layer 13 (hereinafter referred to as organic EL layer) including a light-emitting layer and sandwiched between the electrodes. Specifically, the anode 11 patterned so as to correspond to each of the pixels is formed on the substrate 10. The organic EL layer 13 is formed on the anode 11. The cathode 14 is formed on the organic EL layer 13. The anode 11 is made of a conductive metal material having high reflectivity such as Ag. The anode may be composed of a layered body including layers made of such a metal material and layers made of a transparent conductive material such as ITO (indium-tin-oxide) having good hole injection characteristics. On the other hand, the cathode 14 is formed so as to be common to the plurality of organic EL devices and has a semi-reflective or light transparent structure that can extract light emitted at the light-emitting layer to outside the device. Specifically, when the cathode 14 has a semi-reflective structure to increase the interference effect inside the device, the cathode 14 has a layer formed with a thickness of 2 to 50 nm and made of a conductive metal material such as Ag or AgMg having good electron injection characteristics. Semi-reflectivity is a property that reflects part of light emitted at the inside of the device and transmits part of the light, and the semi-reflectivity means a reflectivity of 20 to 80% for visible light. Light transparency means a transmissivity of 80% or higher for visible light.

The organic EL layer 13 is constituted by a single layer or a plurality of layers including at least a light-emitting layer. Examples of the structure of the organic EL layer 13 include a four-layer structure including a hole-transporting layer, a light-emitting layer, an electron-transporting layer, and an electron injection layer; and a three-layer structure including a hole-transporting layer, a light-emitting layer, and an electron-transporting layer. The organic EL layer 13 can be formed of a publicly known material.

Pixel circuits are formed in the substrate 10 such that each of the organic EL devices can be independently driven. Each of the pixel circuits includes a plurality of transistors (not shown). The substrate 10 having the transistors formed therein is covered with an interlayer insulating film in which a contact hole for electrically connecting the transistors to the anode 11 is formed (not shown). Furthermore, a planarizing film for reducing the surface unevenness caused by the pixel circuits and planarizing the surface is formed on the interlayer insulating film (not shown).

Protective layers are formed on the cathode 14 to protect the organic EL layer 13 from oxygen and water in the air.

The protective layers are constituted by three layers, that is, a first protective layer 15, a second protective layer 16, and a third protective layer 17 from the cathode 14 side.

The first protective layer 15 is made of an inorganic material such as SiN and SiON and protects the organic EL layer 13 from water contained in a resin material constituting the second protective layer 16 that is stacked on the first protective layer 15. The first protective layer 15 can be provided with a function that reduces the stress generated when the resin material is cured. The first protective layer 15 is preferably formed by CVD with a thickness of 0.1 µm or more and 1.0 µm or less.

The second protective layer 16 is made of a transparent resin material having a low water content, which is preferably 100 ppm or less. For transparency, the resin material preferably has a transmissivity of 90% or higher for visible light at a thickness of 10 µm. A thermosetting resin, a photocurable resin, or a thermoplastic resin is preferably used as the resin material. Specific examples of the resin include epoxy resins, polyurethane resins, phenol resins, urea resins, melamine resins, alkyd resins, acrylic reactive resins, and formaldehyde resins. Furthermore, examples of the resin include silicon resins; epoxy/polyamide resins; mixtures of a polyester resin and an isocyanate prepolymer; mixtures of polyester polyol and polyisocyanate; mixtures of polyurethane and polyisocyanate; and polymers, copolymers, or various rubber resins containing, as a constitutional unit, vinyl chloride, vinyl acetate, vinyl alcohol, maleic acid, acrylic acid, acrylic ester, vinylidene chloride, acrylonitrile, methacrylic acid, methacrylic acid ester, styrene, butadiene, ethylene, vinyl butyral, vinyl acetal, and vinyl ether. As described below, a microlens is formed in the second protective layer 16. Therefore, the thickness of the second protective layer 16 is not constant, but the minimum thickness, that is, the thickness in the thinnest portion is preferably 1 µm or more and 50 µm or less. Such a second protective layer can be formed by an application method, a printing method, or the like.

The third protective layer 17 is made of an inorganic material such as SiN and has a function of preventing oxygen and water from entering the organic EL device from the outside. The third protective layer 17 is preferably formed by CVD with a thickness of 0.5 µm or more and 5.0 µm or less.

A plurality of microlenses 16a are formed in an array on the light extraction side (the upward direction in FIG. 1) of the second protective layer 16. A concave portion 16b is formed between the microlenses 16a adjacent to each other, and the concave portion 16b is connected to each of the microlenses 16a such that a smooth curved line is formed. The microlenses 16a can be formed by processing the resin material constituting the second protective layer 16. Specifically, a microlens can be formed by die-stamping or the like. The microlenses 16a are preferably formed such that a single microlens corresponds to each of the pixels (that is, each of the organic EL devices), but a plurality of microlenses may be formed for each of the pixels or a single microlens may be formed for a plurality of pixels. The third protective layer 17 is formed so as to follow the shape of the microlenses 16a.

In such a structure, for example, when a single microlens 16a is formed for one pixel, the light emitted from the organic EL layer 13 passes through the transparent cathode 14. Subsequently, the light passes through the first protective layer 15, the microlens array constituted by the second protective layer 16, and the third protective layer 17 and is emitted to outside the organic EL device.

Figure 2:
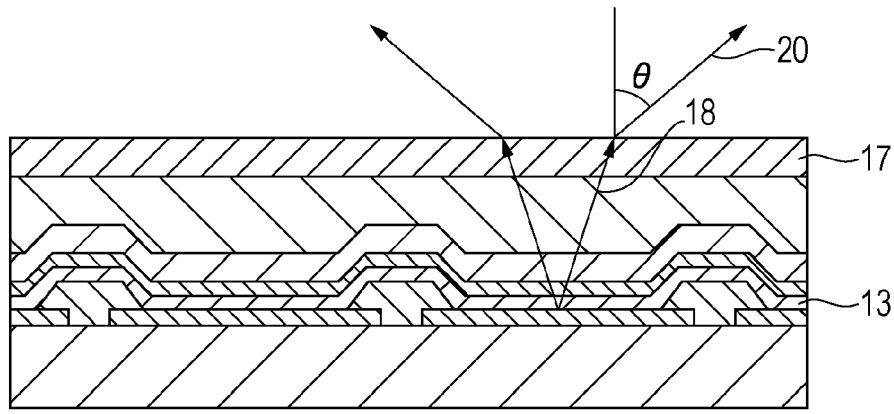
FIG. 2 is a partial sectional view showing a known structure.

In the case where the microlenses 16a are not formed (FIG. 2), the light 18 emitted from the light-emitting layer of the organic EL layer 13 in an oblique direction is emitted from the third protective layer 17 in a more oblique direction (the direction indicated by 20). In contrast, in a structure in which the microlenses 16a are formed as shown in FIG. 1, the light 19 emitted from the third protective layer 17 has an emission angle (the direction indicated by 19) that is closer to being perpendicular to the substrate compared with the case where the microlenses 16a are not formed. Thus, a light-condensing effect in the direction perpendicular to the substrate is improved in the case where the microlenses 16a are formed compared with the case where the microlenses 16a are not formed. In other words, light utilization efficiency in the front direction of the display apparatus can be improved.

In the structure in which the microlenses 16a are formed, the incidence angle of the light 19, emitted from the light-emitting layer in an oblique direction, with respect to the emission interface (the interface between the third protective layer 17 and air) becomes closer to 90 degrees. Therefore, the amount of light subjected to total reflection is decreased, which improves light extraction efficiency.

The light-condensing characteristics depend on the light-emitting area, the curvature of a microlens, and the distance from a light-emitting surface to a lens. A microlens is preferably designed by using these dependences as parameters.

The dependence of the light-condensing characteristics on the light-emitting area is described as follows. The light emitted under the center of a microlens is easily condensed in the front direction whereas the light emitted under the periphery of a microlens is not easily condensed in the front direction.

Figure 3:
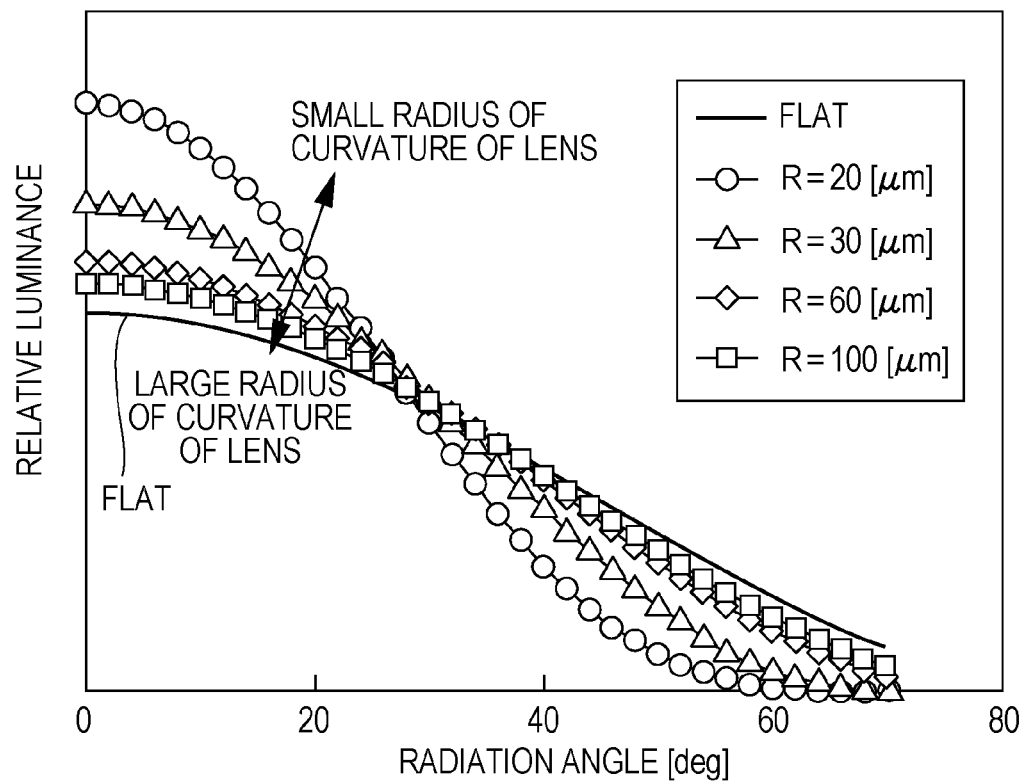
FIG. 3 is a diagram showing the correlation between radiation angle and relative luminance.

The description about curvature of a microlens and the light-condensing characteristics will now be made. FIG. 3 shows a change in the correlation between radiation angle and relative luminance when microlenses have different radii of curvature R [μm] of a lens. In FIG. 3, the term "flat" means the case where microlenses are not formed.

Four microlenses having different radii of curvature R (20, 30, 60, and 100 [μm]) were prepared for measurement. In each of the structures, the pixel pitch was set to 31.5 μm, the maximum width of the microlens 16a was set to 31.5 μm, and the width of a light-emitting region (a light-emitting region of one pixel defined by pixel separating layers) was set to 16.5 μm. The cathode was composed of a mixture of indium oxide and zinc oxide and had a refractive index of 1.9 and a thickness of 0.05 μm. The first protective layer was composed of SiN and had a refractive index of 1.83 and a thickness of 0.18 μm. The second protective layer was composed of an epoxy resin and had a refractive index of 1.54 and a minimum thickness of 10 μm. The third protective layer was composed of SiN and had a refractive index of 1.83 and a thickness of 1 μm.

Relative luminance is a relative value obtained when the luminance at a radiation angle of 0 [deg] in a structure (the structure shown in FIG. 2) in which the microlenses 16a are not formed is assumed to be 1.

As is clear from FIG. 3, at a radiation angle of 30 [deg] or less, the relative luminance is higher in the case where the microlenses 16a are formed than in the case where the microlenses 16a are not formed. It is also clear in the case where the microlenses 16a are formed that the relative luminance is increased as the radius of curvature R is decreased.

On the other hand, at a radiation angle of 30 [deg] or more, it is clear that the relative luminance is higher in the case where the microlenses 16a are not formed than in the case where the microlenses 16a are formed. It is also clear in the case where the microlenses 16a are formed that the relative luminance is increased as the radius of curvature R is increased. That is, it is understood that the light-condensing effect is decreased as the radius of curvature R is increased.

In the above description, the boundary at which the correlation between radiation angle and relative luminance is changed is a radiation angle of 30 [deg], but the boundary in terms of radiation angle varies in accordance with the light-emitting area and the distance from the light-emitting surface to the lens.

However, the correlation between radiation angle and relative luminance does not vary in accordance with the degree of the above-described radius of curvature R of a lens.

<Method for Manufacturing Display Apparatus>

Figure 4A:
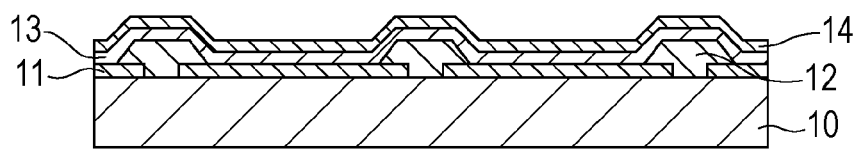
FIGS. 4A to 4F are diagrams showing the steps of manufacturing a display apparatus of the present invention.

A method for manufacturing a display apparatus according to this embodiment will now be described with reference to FIGS. 4A to 4F. FIGS. 4A to 4F are schematic sectional views showing the steps of manufacturing a display apparatus of this embodiment. Since the manufacturing steps until the cathode 14 is formed are publicly known, the descriptions are omitted herein. First, as shown in FIG. 4A, a substrate 10 in which a plurality of top emission-type organic EL devices have been formed is prepared. The organic EL devices are obtained by forming an anode 11, a pixel separating layer 12, an organic EL layer 13, and a cathode 14 on the substrate 10 in which active-matrix pixel circuits have been formed, through an interlayer insulating film and a planarizing film.

Figure 4B:
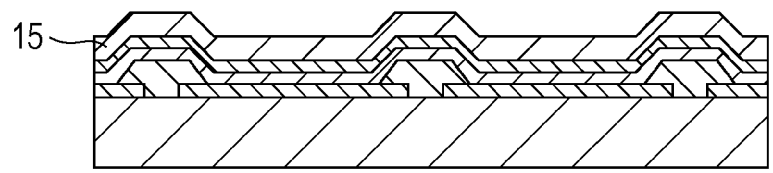

Subsequently, as shown in FIG. 4B, a first protective layer 15 is formed in the entire display region. The first protective layer 15 is a member for preventing the water contained in a resin material constituting a second protective layer formed thereon from contacting the organic EL devices, that is, a member having a sealing function. Therefore, the first protective layer 15 is preferably a member having high light transmissivity and moisture resistance and composed of a silicon nitride film or a silicon oxynitride film.

Figure 4C:
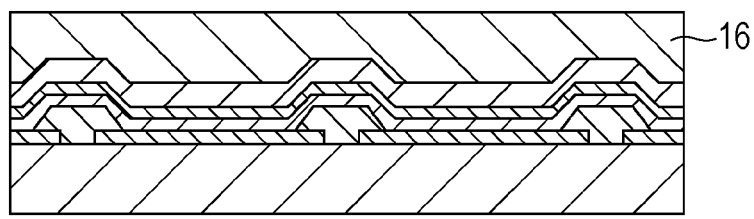

Subsequently, as shown in FIG. 4C, the second protective layer 16 is formed on the first protective layer 15 in the entire display region. The second protective layer 16 is made of a resin material. The thickness of the second protective layer is set to about 10 to 100 μm such that the second protective layer can sufficiently cover dust such as etching residues and the unevenness generated above the pixel separating layer 12 can be planarized. A thermosetting resin, a thermoplastic resin, or a photocurable resin that has a low water content can be used as the resin material. If a thermosetting resin or a photocurable resin is used, the film formation can be performed by a spin coating method, a dispensing method, or the like. Alternatively, there can be employed a method in which a thermoplastic resin film having a thickness of about 10 to 100 μm is attached to the first protective layer 15 under vacuum. Specific examples of the resin material suitably used include epoxy resins and butyl resins.

Figure 4D:
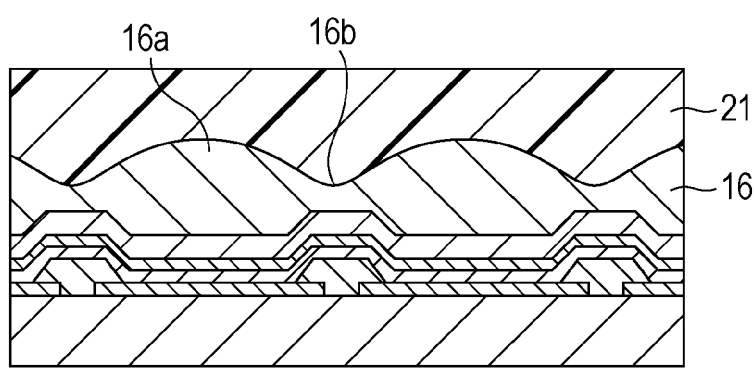

Subsequently, as shown in FIG. 4D, a mold 21 for forming a microlens 16a is prepared, and the mold 21 is pressed against the resin material without mixing bubbles in the resin material.

The mold 21 can be composed of a common metal, but, when a photocurable resin is used as the resin material, the mold 21 is preferably composed of a quarts substrate because light needs to be transmitted. Furthermore, a film made of a fluorocarbon resin or the like may be formed on a surface of the mold 21 to improve the detachability of the mold 21 from the resin material.

If a thermosetting resin is used as the resin material, the resin material is cured through heat treatment at 80° C. while the top of a convex portion of each of the microlenses formed with the mold 21 substantially agrees with the center of the corresponding pixel.

The curing temperature is preferably about 80° C. because the heat-resistance temperature of a common organic compound constituting the organic EL layer 13 is about 100° C.

Figure 4E:
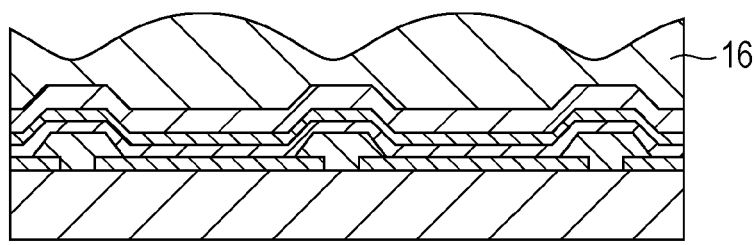

Subsequently, as shown in FIG. 4E, the mold 21 is detached from the cured resin material.

Thus, a microlens 16a corresponding to each of the pixels is formed on a surface of the second protective layer 16. Herein, a concave portion 16b formed between the microlenses adjacent to each other is connected to each of the microlenses such that a smooth curved line (continuous curved line) is formed. As a result, the surface of the second protective layer 16 has no steps and portions in which inclination suddenly changes.

In the presence of such steps or portions in which inclination suddenly changes, when a third protective layer 17 is formed on the microlenses 16a, a material gas is not easily supplied to the corners of steps or the like and thus the film growth is inhibited. Consequently, the third protective layer 17 is formed with cracks, whereby the sealing function of the third protective layer 17 is lost. Thus, the surface profile of the mold 21 is preferably designed and processed such that microlenses having desired light-condensing characteristics can be formed without causing the above-described problem.

When the thickness of the bottom of the concave portion 16b is small, dust such as etching residues cannot be sufficiently covered, which generates pin halls. Therefore, the minimum thickness of the second protective layer at the bottom of the concave portion 16b is set to 1 μm or more. The maximum thickness of the second protective layer at the bottom of the concave portion 16b is set to 50 μm or less to prevent the reduction in light amount due to absorption and the leakage of emitted light from the adjacent pixel.

Figure 4F:
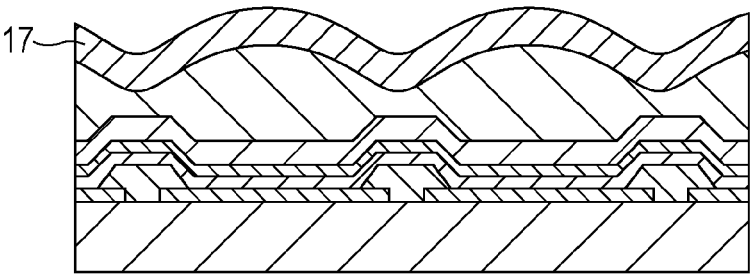

Finally, as shown in FIG. 4F, the third protective layer 17 is formed on the cured second protective layer 16 in the entire display region. The third protective layer 17 is preferably a member having high light transmissivity and moisture resistance and composed of a silicon nitride film or a silicon oxynitride film. The first protective layer 15 and the third protective layer 17 may be made of either the same material or different materials.

Figure 5:
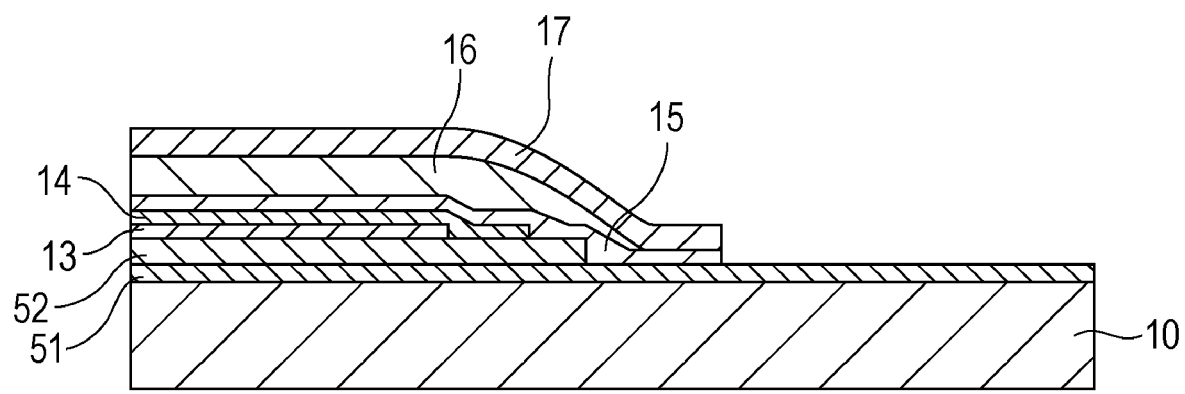
FIG. 5 is a sectional view showing the state of a protective layer in a region outside a display region of an embodiment of the present invention.

As shown in FIG. 5, the first protective layer 15 and the third protective layer 17 are formed so as to directly contact each other in a peripheral region where organic EL devices are not formed, the peripheral region being located outside the display region where organic EL devices are formed, and so as to sandwich the second protective layer 16. In other words, the second protective layer 16 is sealed with the first protective layer 15 and the third protective layer 17.

Thus, water in the air does not enter the resin material constituting the second protective layer 16.

As also shown in FIG. 5, the interlayer insulating film 51 formed between the substrate 10 and the planarizing film 52 and the first protective layer 15 are formed so as to directly contact each other in the peripheral region and sandwich the planarizing film 52, the organic EL layer 13, the cathode 14, and the pixel separating layer (not shown). In other words, the planarizing film 52, the organic EL layer 13, the cathode 14, and the pixel separating layer are sealed with the interlayer insulating film 51 and the first protective layer 15. Since the interlayer insulating film 51 is made of an inorganic material such as silicon nitride, silicon oxynitride, or the like and has high moisture resistance, water can be prevented from entering the inside of the display region from the outside through the planarizing film 52 and the pixel separating layer.

In the steps of forming the microlenses 16a shown in FIGS. 4C, 4D, and 4E, the description about a direct formation method using the mold 21 has been made, but the microlenses can be formed by any of the following methods i) to v):

i) a method in which heat treatment is performed on a resin layer that has been patterned by photolithography or the like and the resin layer is then transformed into a microlens shape by reflowing;

ii) a method in which a photocurable resin layer formed so as to have a uniform thickness is exposed to light having a distribution in an in-plane direction and the resin layer is then developed to form microlenses;

iii) a method in which the surface of a resin material formed so as to have a uniform thickness is processed into a microlens shape using ion beams, electron beams, laser beams, or the like;

iv) a method in which an appropriate amount of resin is dropped on each of pixels to form microlenses in a self-alignment manner; and v) a method in which a resin sheet having microlenses formed therein in advance is prepared in addition to a substrate having organic EL devices formed thereon, and the resin sheet and the substrate are aligned with each other and then attached to each other to form microlenses.

The microlenses of the present invention may have a hemispherical or semicylindrical shape. When microlenses have a semicylindrical shape, the microlenses have a light-condensing function particularly in one of the longitudinal direction and the transverse direction. The end of the semicylindrical shape in the longitudinal direction may have a hemispherical shape or may be formed such that the end face is perpendicular to the substrate.

The display apparatus of the present invention is used for mobile applications in which an improvement in viewability through high luminance is important, such as a back monitor of digital cameras and a display for cellular phones. Furthermore, since low power consumption is expected at the same luminance, the display apparatuses are useful for indoor use.

The present invention is not limited to the above-described structures and various applications and modifications can be made without departing from the spirit of the present invention.

EXAMPLES

Example 1

Pixel circuits (not shown) were formed on a glass substrate using a low-temperature polysilicon TFT, and an interlayer insulating film made of SiN and a planarizing film made of an acrylic resin were formed thereon in that order to prepare a substrate 10 shown in FIG. 4A. An ITO film/AlNd film was formed on the substrate 10 by sputtering with a thickness of 38 nm/100 nm. The ITO film/AlNd film was then patterned for each of pixels to form an anode 11.

An acrylic resin was applied thereon by spin coating. The acrylic resin was then patterned by lithography such that an opening (the opening corresponds to each of the pixels) was formed in a portion where the anode 11 was formed, to form a pixel separating layer 12. The pitch of the pixels was 30 μm and the size of the exposed portion of the anode 11 formed by the opening was 10 μm. The substrate was cleaned through ultrasonic cleaning with isopropyl alcohol (IPA) and then through boiling. After drying, the substrate was subjected to UV/ozone cleaning and an organic EL layer 13 was formed by vacuum deposition.

For the organic EL layer 13, first, a hole-transporting layer was formed on each of the pixels with a thickness of 87 nm. The degree of vacuum during deposition was $1\times10^{-4}$ Pa and the deposition rate was 0.2 nm/sec.

A red light-emitting layer, a green light-emitting layer, and a blue light-emitting layer were formed using a shadow mask with thicknesses of 30 nm, 40 nm, and 25 nm, respectively.

Subsequently, bathophenanthroline (Bphen) was formed as an electron-transporting layer common to all of the pixels by vacuum deposition with a thickness of 10 nm. The degree of vacuum during deposition was $1\times10^{-4}$ Pa and the deposition rate was 0.2 nm/sec.

After that, Bphen and $Cs_2CO_3$ were formed as a common electron injection layer by codeposition (90:10 by weight) with a thickness of 40 nm. The degree of vacuum during deposition was $3\times10^{-4}$ Pa and the deposition rate was 0.2 nm/sec.

The substrate on which the organic EL layer 13 having the hole-transporting layer to the electron injection layer was formed was transferred to a sputtering apparatus while the vacuum state was maintained. Ultrathin Ag was formed as a cathode 14 with a thickness of 10 nm, and a mixture of indium oxide and zinc oxide was then formed as a transparent electrode layer with a thickness of 50 nm.

As shown in FIG. 4B, a first protective layer 15 made of silicon nitride was formed by plasma CVD using $SiH_4$ gas, $N_2$ gas, and $H_2$ gas. Subsequently, as shown in FIG. 4C, a thermosetting resin material (epoxy resin) having a viscosity of 3000 mPa·s was applied in a nitrogen atmosphere with a dew point of 60° C. using a dispenser (product name: SHOT MINI SL available from Musashi Engineering, Inc.) that can precisely perform drawing.

Before the resin material was cured by heating, as shown in FIG. 4D, a mold 21 used for forming a microlens 16a and prepared independently was pressed against a surface of the resin material. During the pressing, positioning was performed by aligning an alignment mark formed on the mold 21 with an alignment mark formed on the substrate. As a result, the microlens 16a was formed so as to correspond to each of the pixels. For the mold 21, concave portions were formed at the same pitch as that of the pixels, and the surfaces of the concave portions were coated with a Teflon (registered trademark) resin as a release agent. The shape of the concave portion, that is, the shape of the microlens 16a had a radius of curvature of 30 μm. Because the pitch was 30 μm, the height of the microlens array was about 4 μm.

In consideration of the environments of a clean room and a processing apparatus, the minimum thickness (the thickness in the thinnest portion) of a second protective layer 16 was set to 10 μm because planarization needs to be achieved using the resin material even if there is foreign matter or the like.

The resin material (epoxy resin) was cured by heating at a temperature of 100° C. for 15 minutes under vacuum while the mold 21 was pressed against the resin material as described above. The mold 21 was then detached from the resin material to form the microlens 16a shown in FIG. 4E.

Furthermore, as shown in FIG. 4F, a protective layer (third protective layer 17) made of an inorganic material such as silicon nitride was formed by plasma CVD using $SiH_4$ gas, $N_2$ gas, and $H_2$ gas. The third protective layer 17 was formed so as to have a thickness of 1 μm and cover the entire surface of a display region where organic EL devices were formed.

The luminance of the thus-manufactured display apparatus of the present invention was measured. When the display apparatus was viewed from the front, the luminance was about 1.6 times as high as that of a display apparatus in which microlenses are not formed.

Since the second protective layer 16 in which microlenses were formed was completely covered with the first protective layer 15 and the third protective layer 17, water did not enter the resin even in a high temperature and humidity environment. Thus, the light-condensing characteristics of a lens were not changed due to the swelling of the resin.

Example 2

Unlike Example 1, a microlens array was formed through the steps shown in FIGS. 6A to 6E. Since the steps until the first protective layer 15 is formed are the same as those of Example 1, the descriptions are omitted and a step of forming the second protective layer 16 and the following steps will be described.

Figure 6A:
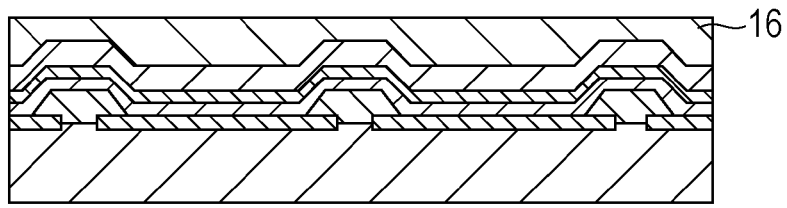
FIGS. 6A to 6E are diagrams showing the steps of manufacturing a display apparatus of Example 2 of the present invention.
Figure 6B:
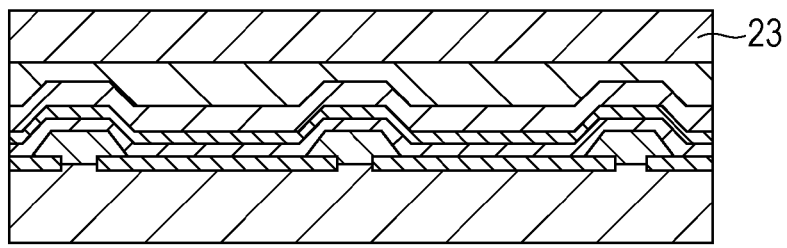

First, a thermosetting epoxy resin (second protective layer 16) having a viscosity of 3000 mPa·s was applied in a nitrogen atmosphere with a dew point of 60° C. with a thickness of 10 μm using a dispenser (product name: SHOT MINI SL available from Musashi Engineering, Inc.) that can precisely perform drawing (FIG. 6A). The epoxy resin was then cured by heating at a temperature of 100° C. for 15 minutes under vacuum.

Figure 6C:
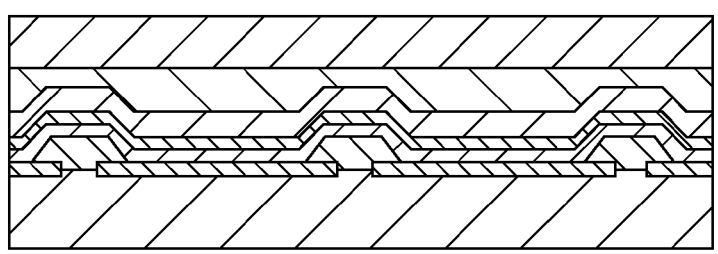
Figure 6D:
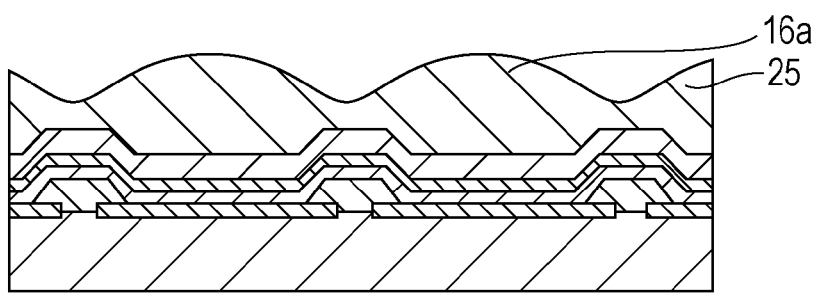

Subsequently, a resin 23, which is the same as the epoxy resin, was applied on the epoxy resin with a thickness of 4 μm (FIG. 6B), and exposure was performed on the resin 23 using a photomask 24 (FIG. 6C). The exposure was set so as to have a two-dimensional distribution calculated from the shape of a microlens 16a. By developing the exposed resin, a microlens 16a having a desired shape was formed (FIG. 6D). The exposure in an in-plane direction was controlled by adjusting the transmissivity of the photomask 24 in the in-plane direction. The resin was then cured by heating at a temperature of 100° C. for 15 minutes under vacuum again. This heat treatment also served as the planarization of a microlens surface. The minimum thickness (the thickness in the thinnest portion) of the second protective layer 16 was set to 10 μm in order to bury any foreign matter or the like in the resin material.

Figure 6E:
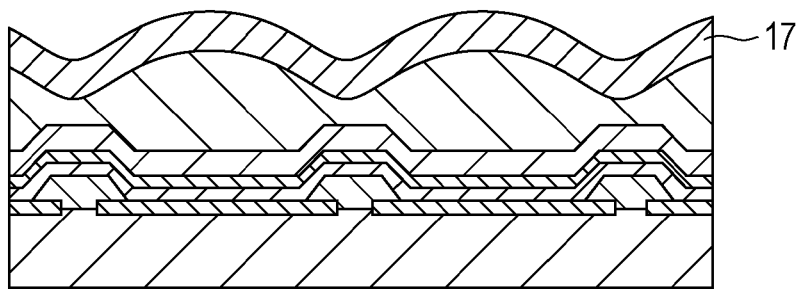

Finally, a protective layer (third protective layer 17) made of an inorganic material such as silicon nitride was formed by plasma CVD using $SiH_4$ gas, $N_2$ gas, and $H_2$ gas. The third protective layer 17 was formed so as to have a thickness of 1 μm and cover the entire surface of a display region where organic EL devices were formed (FIG. 6E).

Figure 7:
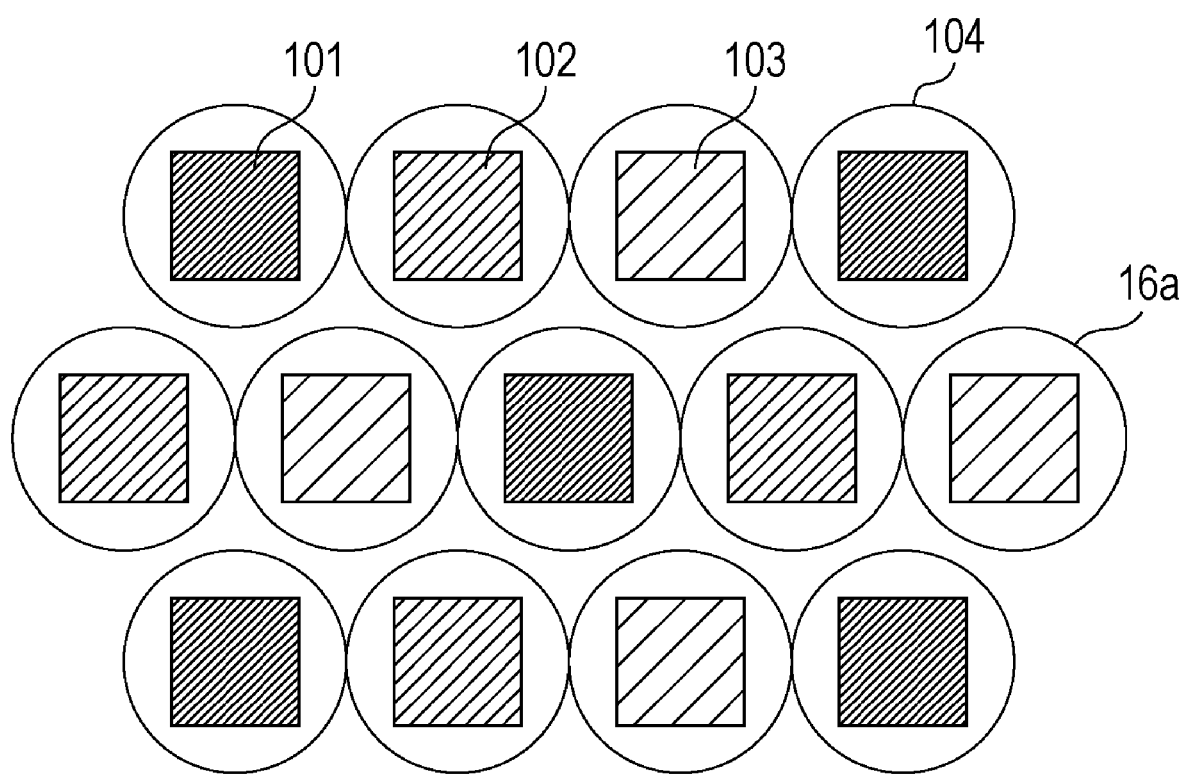
FIG. 7 is a diagram showing a pixel arrangement and microlens shape of the display apparatus of the present invention.

In the above-described Examples, the arrangement of the pixels has not been mentioned, but the microlens 16a preferably has a shape below in accordance with the arrangement of the pixels. FIG. 7 is a front view of the display apparatus of the present invention. When the arrangement of the pixels is a delta arrangement of RGB as shown in FIG. 7, the microlens 16a is preferably formed such that the external shape is a circular shape when the display apparatus is viewed from the front. In FIG. 7, 101 denotes a pixel of R (red light emission), 102 denotes a pixel of G (green light emission), and 103 denotes an pixel of B (blue light emission). Furthermore, 104 denotes the external shape of the microlens 16*a*. In FIG. 7, a single microlens 16*a* is formed for each of the RGB pixels.

Figure 8A:
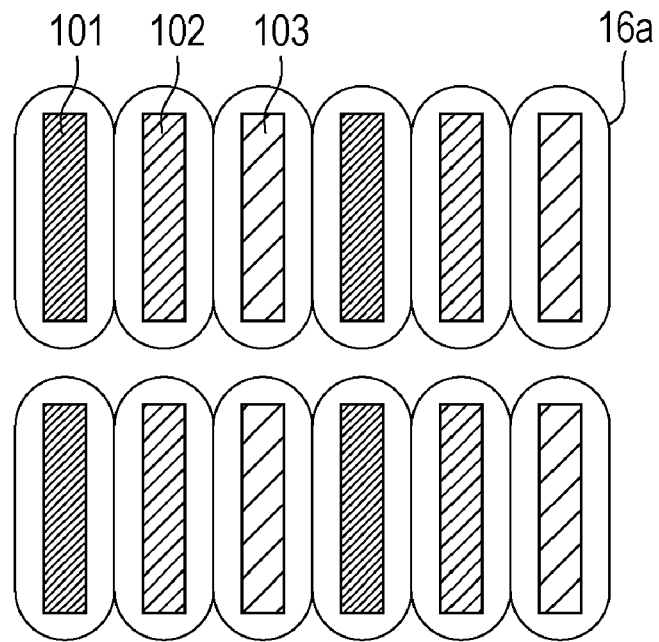
FIG. 8A is a front view and FIG. 8B is a perspective view, both showing another pixel arrangement and microlens shape of the display apparatus of the present invention.
Figure 8B:
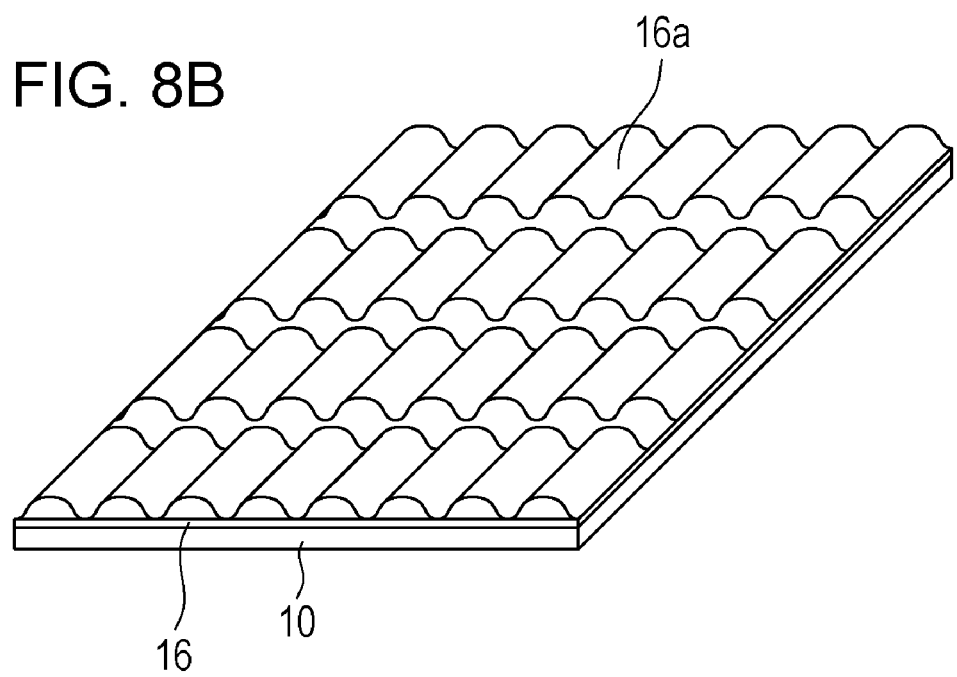

When the pixels are arranged in a stripe as shown in FIGS. 8A and 8B, the microlens 16*a* is preferably formed in an elongated semicylindrical shape so as to cover one sub-pixel. Herein, the same reference numerals as those in FIG. 7 denote the same parts. FIG. 8A is a front view of the display apparatus of the present invention. As shown in FIG. 8A, a single microlens 16*a* is formed for each of RGB pixels. FIG. 8B is a perspective view of the display apparatus shown in FIG. 8A. In FIG. 8B, the first protective layer and the third protective layer are not shown. When the semicylindrical microlens array shown in FIGS. 8A and 8B is used, light-condensing effect in the front direction is produced only in the left-right direction of FIG. 8A and there is no light-condensing effect in the up-down direction of FIG. 8A.

Figure 9A:
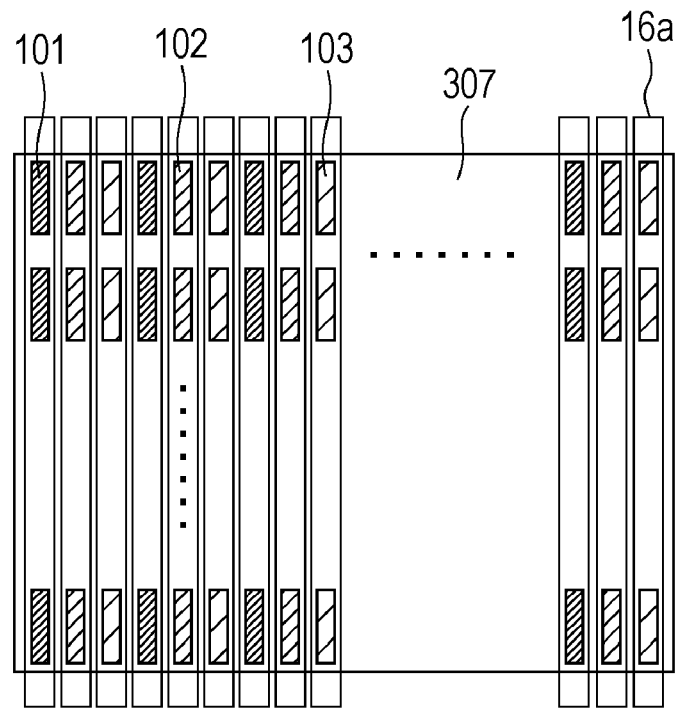
FIG. 9A is a front view and FIG. 9B is a perspective view, both showing still another pixel arrangement and microlens shape of the display apparatus of the present invention.
Figure 9B:
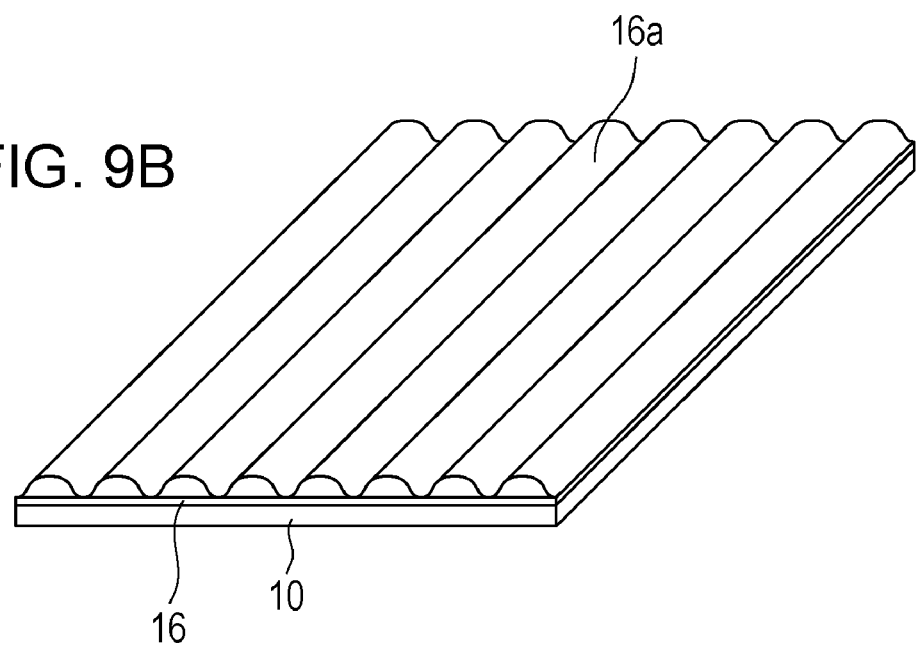

FIGS. 9A and 9B show a modification of the semicylindrical microlens shown in FIGS. 8A and 8B. Herein, the same reference numerals as those in FIG. 7 denote the same parts. As shown in FIGS. 9A and 9B, the microlens 16*a* had a semicylindrical shape that extends in the up-down direction of FIG. 9A and was formed so as to be common to the pixels arranged in a line in the up-down direction of FIG. 9A. Specifically, a single elongated semicylindrical microlens 16*a* was formed for each arranged column of R pixels, G pixels, and blue pixels. The light-condensing effect is the same as that of the microlens shown in FIGS. 8A and 8B, and light-condensing effect in the front direction is produced only in the left-right direction of FIG. 9A and there is no light-condensing effect in the up-down direction of FIG. 9A.

In the delta arrangement of the RGB pixels shown in FIG. 7, the microlens may be formed in a semicylindrical shape that extends in the left-right direction of FIG. 7. In this case, light-condensing effect in the front direction is produced only in the up-down direction of FIG. 7 and there is no light-condensing effect in the left-right direction of FIG. 7.

According to the above-described structure of the present invention, particles such as etching residues and dust can be sufficiently covered with a second protective layer made of a resin material that can be easily thickened, and light utilization efficiency can be improved with a function of a microlens. Furthermore, since a third protective layer made of an inorganic material is formed on a surface of the microlens, a change in the microlens over time can be suppressed and thus light extraction efficiency is stably improved. In addition, since the second protective layer made of a resin material also serves as a resin layer constituting the microlens, the total number of layers can be decreased. Thus, the manufacturing cost can be reduced.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

REFERENCE SIGNS LIST

10 substrate
11 anode
13 organic EL layer
14 cathode
15 first protective layer
16 second protective layer
16*a* microlens
17 third protective layer
51 interlayer insulating film
52 planarizing film

The invention claimed is:

1. A display apparatus comprising:
a plurality of organic EL devices each including a pair of electrodes and an organic compound layer that includes a light-emitting layer and is sandwiched between the pair of electrodes, the plurality of organic EL devices being formed on a substrate; and
a protective layer formed on the plurality of organic EL devices,
wherein
the protective layer includes a first protective layer made of an inorganic material, a second protective layer formed on the first protective layer and made of a resin material, and a third protective layer formed on the second protective layer and made of an inorganic material;
a lens configured to condense at least part of light emitted at the light-emitting layer is formed in the second protective layer, and
the lens is formed so as to be common to a plurality of organic EL devices, and
wherein
each of the plurality of organic EL devices covered with one common lens is covered only with the common lens.

2. A display apparatus comprising:
a plurality of organic EL devices each including a pair of electrodes and an organic compound layer that includes a light-emitting layer and is sandwiched between the pair of electrodes, the plurality of organic EL devices being formed on a substrate; and
a protective layer formed on the plurality of organic EL devices,
wherein
a lens configured to condense at least part of light emitted at the light-emitting layer is formed in the protective layer, and
the lens is formed so as to be common to the plurality of organic EL devices, and
wherein
each of the plurality of organic EL devices covered with one common lens is covered only with the common lens.

3. A display apparatus according to claim 1, wherein the lens has a semicylindrical shape that extends so as to cover the plurality of organic EL devices.

4. A display apparatus according to claim 1, wherein a portion formed between the lenses adjacent to each other is connected to each of the lenses such that a continuous curved line is formed.

5. A display apparatus according to claim 1, wherein the protective layer is formed to protect the organic EL devices from oxygen and water in the air.

6. A display apparatus according to claim 1, wherein the resin material has a water content of 100 ppm or less.

* * * * *